US009455269B1

(12) United States Patent
Noda

(10) Patent No.: US 9,455,269 B1
(45) Date of Patent: Sep. 27, 2016

(54) SEMICONDUCTOR MEMORY DEVICE

(71) Applicant: Kabushiki Kaisha Toshiba, Minato-ku (JP)

(72) Inventor: Kotaro Noda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/735,449

(22) Filed: Jun. 10, 2015

Related U.S. Application Data

(60) Provisional application No. 62/135,394, filed on Mar. 19, 2015.

(51) Int. Cl.
*H01L 29/76* (2006.01)
*H01L 27/115* (2006.01)

(52) U.S. Cl.
CPC ... *H01L 27/11582* (2013.01); *H01L 27/11556* (2013.01)

(58) Field of Classification Search
CPC ............ H01L 27/11582; H01L 27/11556; H01L 27/11521; H01L 27/11529; H01L 27/11524; H01L 29/7926; H10L 27/115
See application file for complete search history.

(56) References Cited

U.S. PATENT DOCUMENTS

| | | | |
|---|---|---|---|
| 5,834,809 A | 11/1998 | Kato et al. | |
| 5,895,946 A * | 4/1999 | Hamamoto | ....... H01L 27/10841 257/301 |
| 7,432,199 B2 * | 10/2008 | Lee | ....... H01L 27/105 257/E21.597 |
| 2008/0067554 A1 * | 3/2008 | Jeong | ....... H01L 27/115 257/211 |
| 2008/0272434 A1 * | 11/2008 | Park | ....... H01L 27/115 257/347 |
| 2009/0294824 A1 * | 12/2009 | Gomikawa | ....... H01L 27/11521 257/315 |
| 2012/0018797 A1 * | 1/2012 | Yu | ....... H01L 21/28518 257/324 |
| 2012/0120740 A1 * | 5/2012 | Shim | ....... G11C 16/14 365/189.14 |
| 2013/0026566 A1 * | 1/2013 | Kutsukake | ....... H01L 21/823481 257/336 |

FOREIGN PATENT DOCUMENTS

| | | |
|---|---|---|
| JP | 4-337634 | 11/1992 |
| JP | 8-213479 | 8/1996 |
| JP | 3439097 | 8/2003 |

* cited by examiner

*Primary Examiner* — Yosef Gebreyesus
(74) *Attorney, Agent, or Firm* — Oblon, McClelland, Maier & Neustadt, L.L.P.

(57) ABSTRACT

A semiconductor memory device according to an embodiment comprises: a memory cell array, the memory cell array including: a conductive layer, an inter-layer insulating layer, and a conductive line stacked on a semiconductor substrate in a stacking direction; first and second connecting lines that contact the semiconductor substrate and are electrically connected to the conductive line and that extend in the stacking direction; and a columnar body that penetrates the conductive layer and the inter-layer insulating layer in the stacking direction between the first and second connecting lines and that includes a first semiconductor layer, the semiconductor substrate having: a first impurity region to which a first impurity is added at a place of contact with the first connecting line; and a second impurity region to which a second impurity different from the first impurity is added at a place of contact with the second connecting line.

20 Claims, 20 Drawing Sheets

SEMICONDUCTOR MEMORY DEVICE

CROSS-REFERENCE TO RELATED APPLICATIONS

This application is based upon and claims the benefit of priority from the prior U.S. Provisional Application 62/135,394, filed on Mar. 19, 2015, the entire contents of which are incorporated herein by reference.

BACKGROUND

1. Field

An embodiment of the present invention relates to a semiconductor memory device.

2. Description of the Related Art

One kind of semiconductor memory device is a flash memory. Generally, a NAND type flash memory in particular is widely used since it is low cost and has a large capacity. Moreover, up to now, many technologies for further increasing the capacity of this NAND type flash memory have been proposed. One such technology is a structure in which memory cells are three-dimensionally disposed.

DETAILED DESCRIPTION

A semiconductor memory device according to an embodiment comprises: a memory cell array, the memory cell array including: a conductive layer stacked on a semiconductor substrate; an inter-layer insulating layer disposed on the conductive layer; a conductive line disposed on the inter-layer insulating layer; a first connecting line and a second connecting line that contact the semiconductor substrate and are electrically connected to the conductive line and that at least extend in a stacking direction of the conductive layer and the inter-layer insulating layer; and a columnar body that penetrates the conductive layer and the inter-layer insulating layer in the stacking direction between the first connecting line and the second connecting line and that includes a first semiconductor layer, the semiconductor substrate having: a first impurity region to which a first impurity is added at a place of contact with the first connecting line; and a second impurity region to which a second impurity different from the first impurity is added at a place of contact with the second connecting line.

A semiconductor memory device according to an embodiment will be described below with reference to the drawings.

First, an overall configuration of a semiconductor memory device according to an embodiment will be described.

Figure 1:
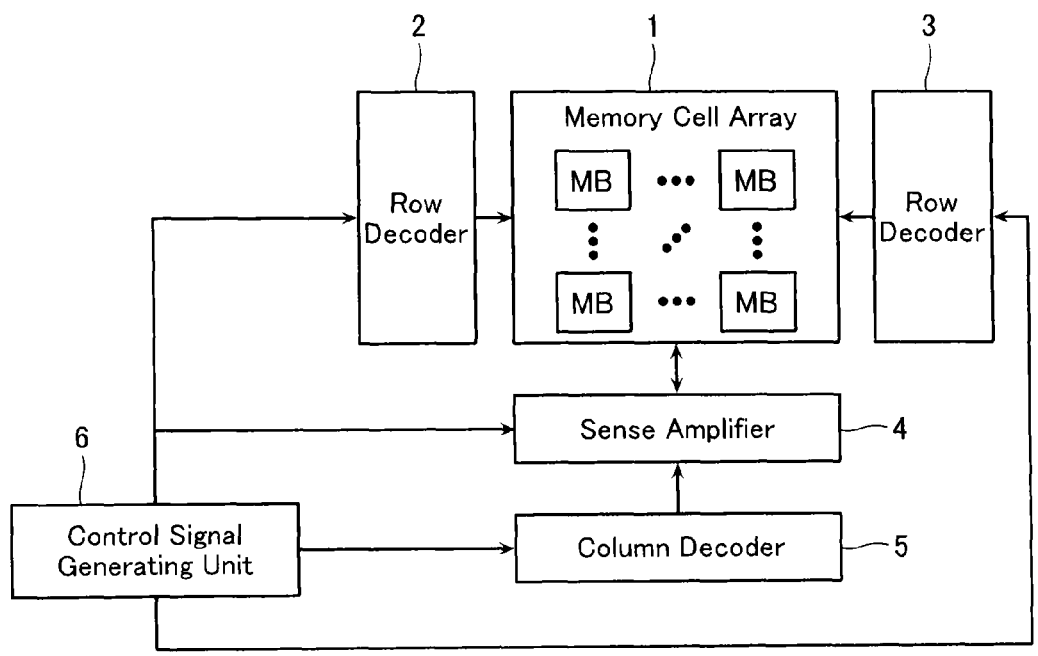
FIG. 1 is a view showing functional blocks of a semiconductor memory device according to an embodiment.

FIG. 1 is a view showing functional blocks of the semiconductor memory device according to the embodiment.

The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or an erase operation, generates a control signal and controls the row decoders 2 and 3, the sense amplifier 4, and the column decoder 5.

Next, a circuit configuration of the memory cell array 1 will be described.

Figure 2:
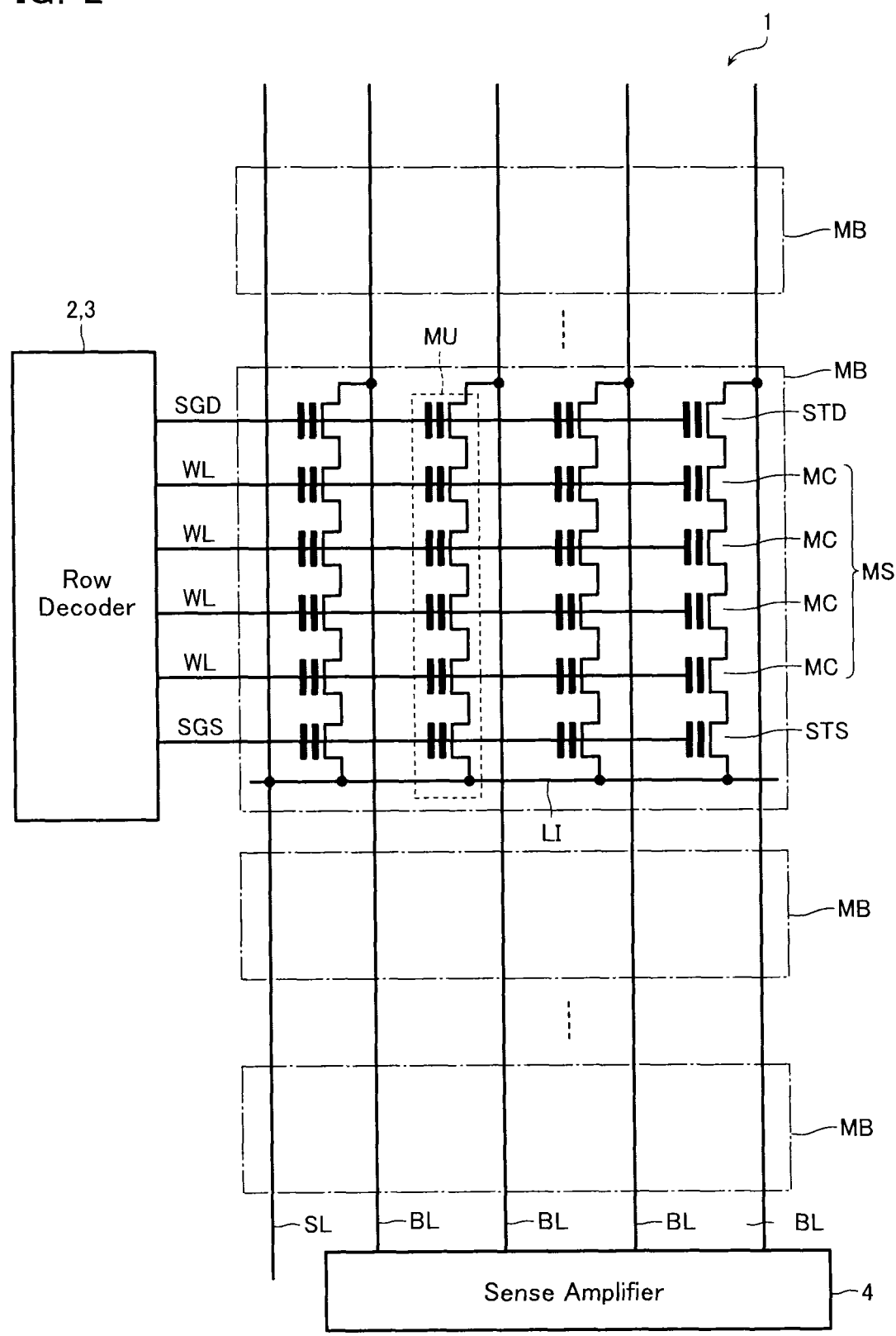
FIG. 2 is an equivalent circuit diagram of a memory cell array in the semiconductor memory device according to the embodiment.

FIG. 2 is an equivalent circuit diagram of the memory cell array in the semiconductor memory device according to the embodiment.

As shown in FIG. 2, the memory cell array 1 includes the plurality of memory blocks MB. Commonly connected to these plurality of memory blocks MB are a plurality of bit lines BL and a source line SL. Each of the memory blocks MB is connected to the sense amplifier 4 via the bit line BL, and is connected to an unillustrated source line driver via the source line SL.

The memory block MB includes a plurality of memory units MU that have their one ends connected to the bit line BL and have their other ends connected to the source line SL via a source contact LI. Each of the memory units MU includes: a memory string MS; a source side select transistor STS connected between the memory string MS and the source contact LI; and a drain side select transistor STD connected between the memory string MS and the bit line BL.

The memory string MS includes a plurality of the memory cells MC connected in series. Each of the memory cells MC is a transistor having a semiconductor layer, a charge accumulation layer, and a control gate, and accumulates a charge in the charge accumulation layer based on a voltage applied to the control gate, thereby changing a threshold value of the memory cell MC. Commonly connected to the control gates of a plurality of the memory cells MC belonging to different memory strings MS are, respectively, word lines WL. These plurality of memory cells MC are connected to the row decoder 2 or 3 via the word line WL.

The source side select transistor STS has a control gate to which a source side select gate line SGS is connected. The source side select gate line SGS is connected to the row decoder 2 or 3, and selectively connects the memory string MS and a semiconductor substrate based on an inputted signal.

The drain side select transistor STD has a control gate to which a drain side select gate line SGD is connected. The drain side select gate line SGD is connected to the row decoder 2 or 3, and selectively connects the memory string MS and the bit line BL based on an inputted signal.

Next, a schematic structure of the memory cell array 1 will be described.

Figure 3:
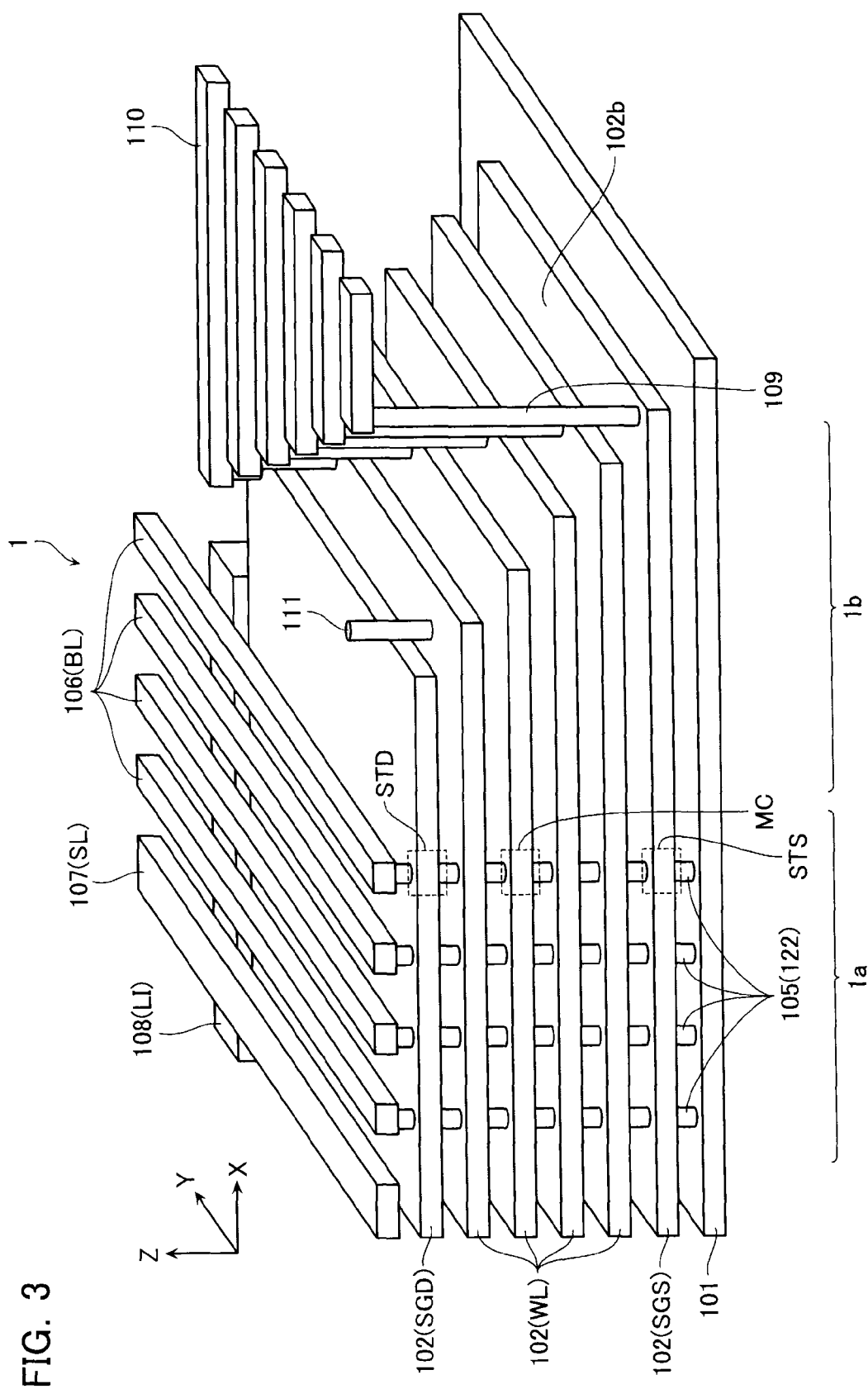
FIG. 3 is a perspective view showing a schematic structure of the memory cell array in the semiconductor memory device according to the embodiment.

FIG. 3 is a perspective view showing the schematic structure of the memory cell array in the semiconductor memory device according to the embodiment.

As shown in FIG. 3, the memory cell array 1 includes: a semiconductor substrate 101; and a plurality of conductive layers 102 stacked in a Z direction (stacking direction) on the semiconductor substrate 101.

In addition, the memory cell array 1 includes a plurality of memory columnar bodies 105 extending in the Z direction. An intersection of the conductive layer 102 and the memory columnar body 105 functions as the source side select transistor STS, the memory cell MC, or the drain side select transistor STD. The conductive layer 102 is formed from the likes of tungsten (W) or polysilicon (Poly-Si), for example, and functions as the source side select gate line SGS, the word line WL, and the drain side select gate line SGD.

The plurality of conductive layers 102 are formed in steps. That is, a certain conductive layer 102 has a contact portion 102b that does not face a lower surface of another conductive layer 102 positioned in a layer above. Moreover, the conductive layer 102 is connected to a via 109 at this contact portion 102b. A wiring line 110 is disposed on an upper end of the via 109. Note that the via 109 and the wiring line 110 are formed from the likes of tungsten (W), for example.

In addition, the memory cell array 1 includes a conductive layer 108 that faces side surfaces in a Y direction of the plurality of conductive layers 102 and extends in an X direction. A lower surface of the conductive layer 108 contacts the semiconductor substrate 101. The conductive layer 108 is formed from the likes of tungsten (W), for example, and functions as the source contact LI.

Moreover, the memory cell array 1 includes a plurality of conductive lines 106 and a conductive line 107 that are positioned above the plurality of conductive layers 102 and the memory columnar body 105, are aligned in plurality in the X direction, and extend in the Y direction. The memory columnar bodies 105 are respectively electrically connected to lower surfaces of the conductive lines 106. Note that the conductive line 106 is formed from the likes of tungsten (W), for example, and functions as the bit line BL. The conductive layer 108 is electrically connected to a lower surface of the conductive line 107. Note that the conductive line 107 is formed from, for example, tungsten (W), and functions as the source line SL.

Furthermore, the memory cell array 1 includes a beam columnar body 111. The beam columnar body 111 supports a posture of an unillustrated inter-layer insulating layer disposed between the conductive layers 102, in a manufacturing step.

Note that hereafter, a region where the plurality of memory columnar bodies 105 are disposed, of the memory cell array 1 will sometimes also be referred to as "memory region 1a", and a region where the contact portion 102b of the plurality of conductive layers 102 is formed, of the memory cell array 1 will sometimes also be referred to as "contact region 1b".

Next, a schematic structure of the memory cell MC of the embodiment will be described.

Figure 4:
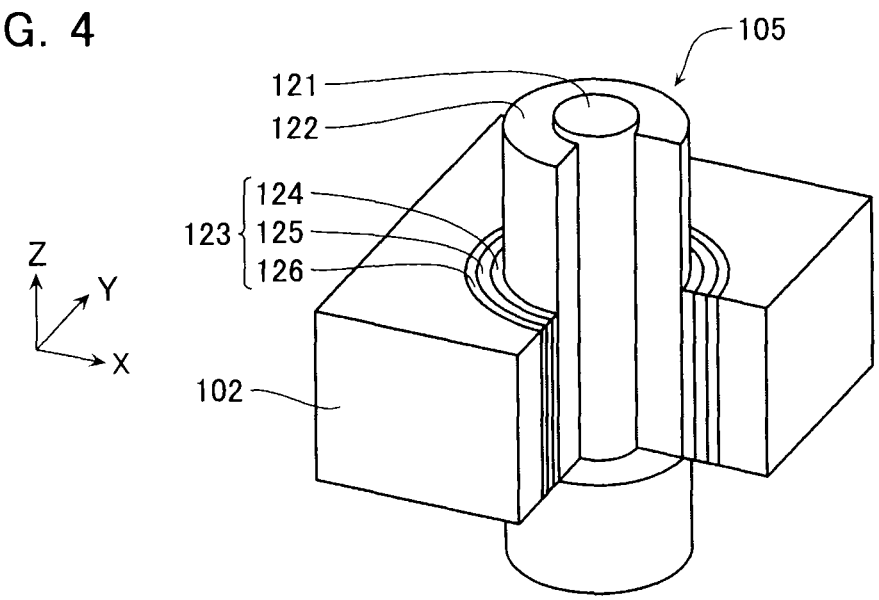
FIG. 4 is a perspective view showing a structure of a memory columnar body and a periphery thereof, of the memory cell array in the semiconductor memory device according to the embodiment.

FIG. 4 is a perspective view showing the schematic structure of the memory cell in the semiconductor memory device according to the embodiment. Note that a similar structure to that of FIG. 4 may be adopted also for the source side select transistor STS and the drain side select transistor STD.

The memory cell MC is formed at an intersection of the conductive layer 102 and the memory columnar body 105. The memory columnar body 105 includes: a core insulating layer 121; and a semiconductor layer 122 that covers a side surface of the core insulating layer 121. Moreover, the memory cell array 1 includes a multi-film layer 123 disposed between the semiconductor layer 122 and the conductive layer 102. The multi-film layer 123 includes the following, deposited from the semiconductor layer 122 to the conductive layer 102, namely: a tunnel insulating layer 124; a charge accumulation layer 125; a cover insulating layer 126; and a block insulating layer 127. In the case of the embodiment, configurations from the core insulating layer 121 to the cover insulating layer 126 are included in the memory columnar body 105.

The core insulating layer 121 is formed from the likes of silicon oxide ($SiO_2$), for example. The semiconductor layer 122 is formed from the likes of polysilicon (Poly-Si), for example, and functions as a channel of the memory cell MC, the source side select transistor STS, and the drain side select transistor STD. The tunnel insulating layer 124 is formed from the likes of silicon oxide ($SiO_2$), for example. The charge accumulation layer 125 is formed from a material capable of charge accumulation, such as silicon nitride (SiN), for example. The cover insulating layer 126 is formed from the likes of silicon oxide ($SiO_2$), for example. The block insulating layer 127 is formed from the likes of silicon oxide ($SiO_2$), for example.

Note that the multi-film layer 123 may have a block high-permittivity layer and a barrier layer deposited therein, from the block insulating layer 126 to the conductive layer 102. The block high-permittivity layer is formed from a metal oxide such as alumina ($Al_2O_3$) or hafnium oxide ($HfO_x$), for example. The barrier layer is formed from a metal nitride such as titanium nitride (TiN), tungsten nitride (WN), and tantalum nitride (TaN), for example.

Next, the structure of the memory cell array 1 will be described in detail.

Figure 5:
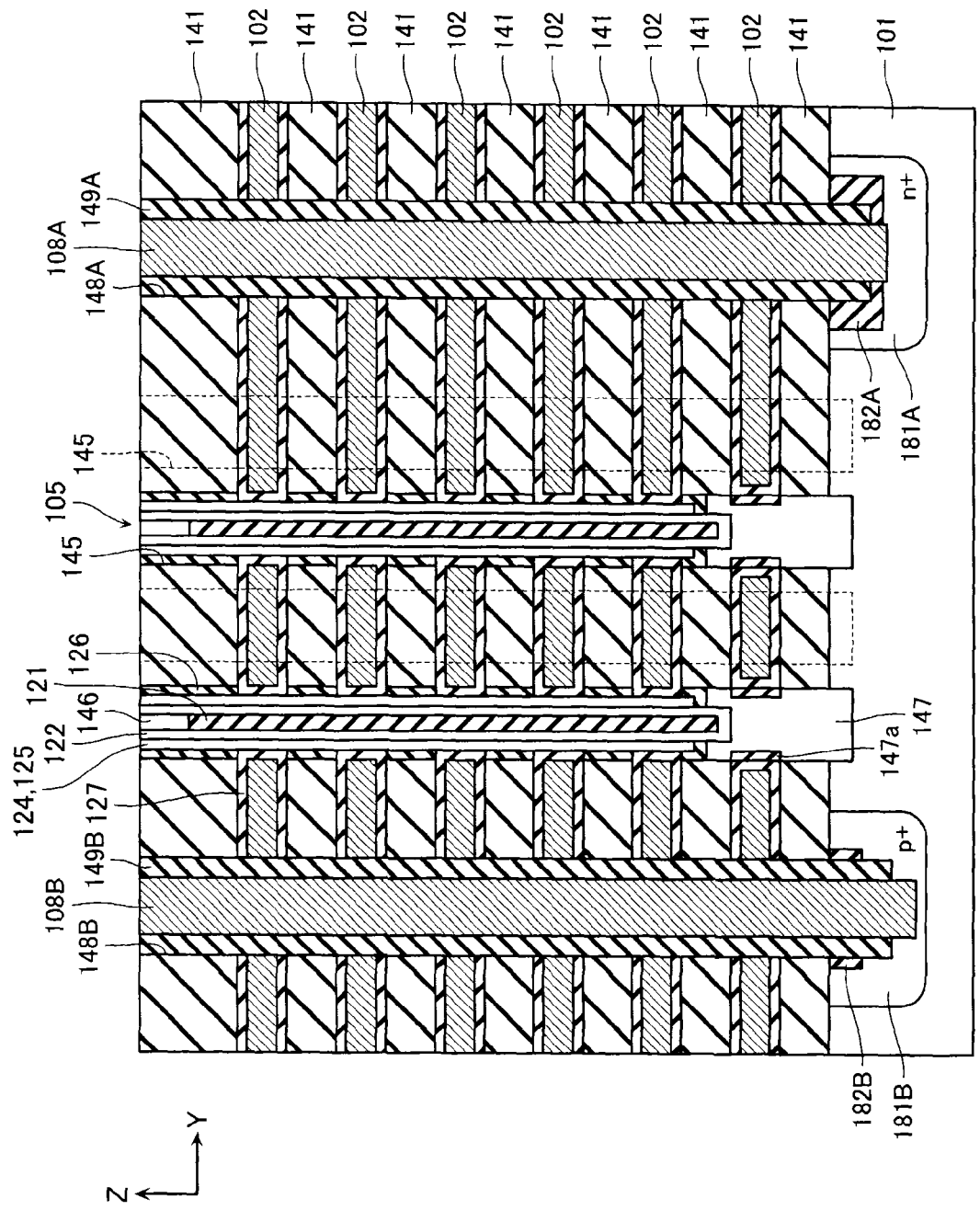
FIGS. 5 and 6 are cross-sectional views of a memory region of the memory cell array in the semiconductor memory device according to the embodiment.
Figure 6:
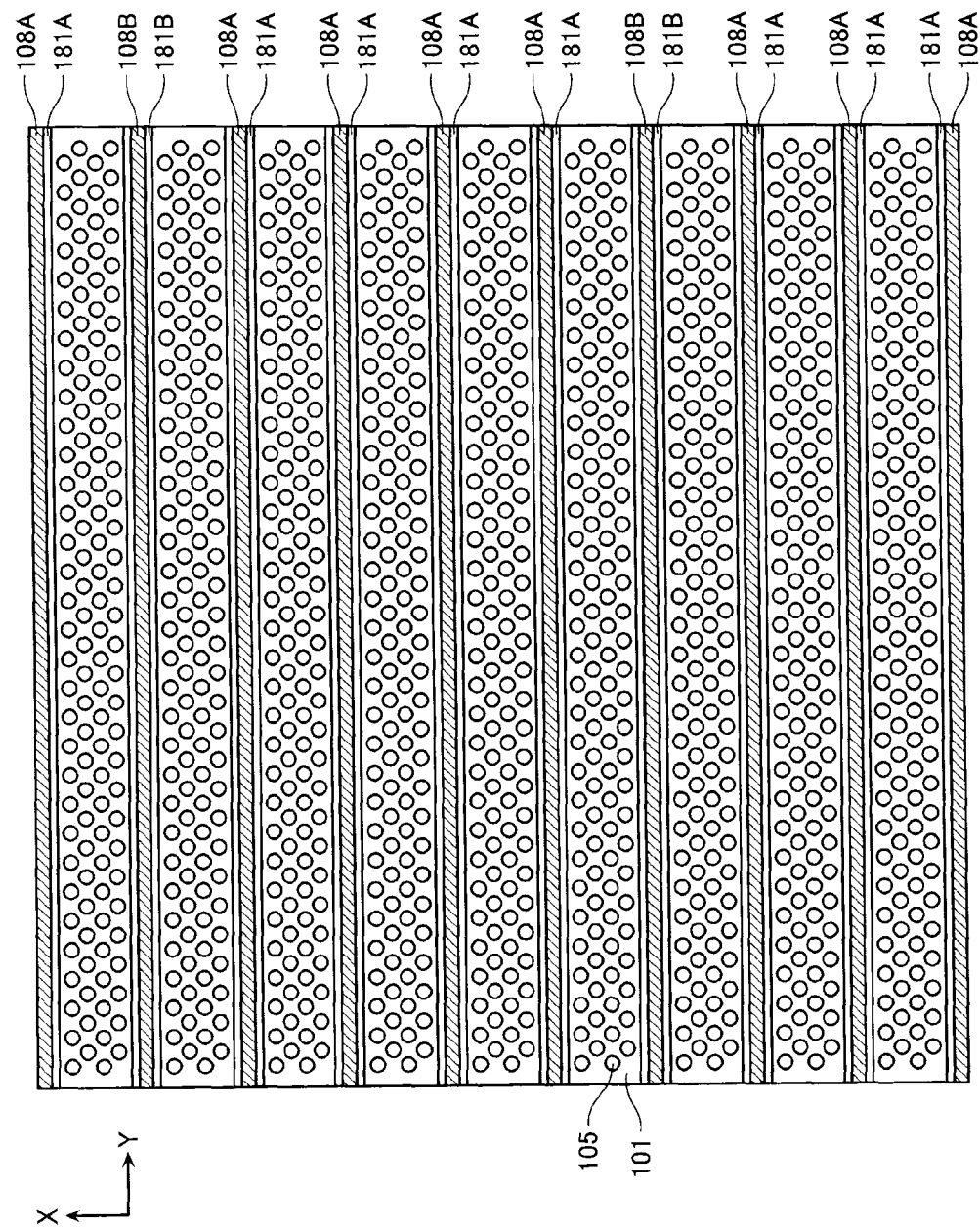

FIGS. 5 and 6 are cross-sectional views of the memory region of the memory cell array in the semiconductor memory device according to the embodiment. FIG. 5 is a cross-sectional view in the Y-Z directions; and FIG. 6 is a cross-sectional view in the X-Y directions at a position of an outer surface of the semiconductor substrate 101 in the Z direction.

The memory cell array 1 includes an inter-layer insulating layer 141 and the conductive layer 102 stacked in plurality alternately on the semiconductor substrate 101. In addition, the memory cell array 1 has formed therein a plurality of memory holes 145 that penetrate in the Z direction from the lowermost layer inter-layer insulating layer 141 to the uppermost layer inter-layer insulating layer 141 and reach an upper portion of the semiconductor substrate 101, and these memory holes 145 are buried with a plurality of the memory columnar bodies 105.

As previously mentioned, the memory columnar body 105 includes the following, from the center to the outside thereof, namely: the core insulating layer 121; the semiconductor layer 122; the tunnel insulating layer 124 and charge accumulation layer 125; and the cover insulating layer 126. The core insulating layer 121 is formed roughly from an upper surface position of the lowermost layer conductive layer 102 to an intermediate position of the uppermost layer inter-layer insulating layer 141 in the Z direction. The semiconductor layer 122 is formed roughly from the upper surface position of the lowermost layer conductive layer 102 to an upper surface position of the uppermost layer inter-layer insulating layer 141 in the Z direction. Moreover, the semiconductor layer 122 is formed so as to cover a bottom surface and a side surface of the core insulating layer 121. The tunnel insulating layer 124 and charge accumulation layer 125 and the cover insulating layer 126 are formed roughly from an intermediate position of the second-from-bottom inter-layer insulating layer 141 to the upper surface position of the uppermost layer inter-layer insulating layer 141 in the Z direction. The cover insulating layer 126 is divided at a position of the semiconductor layer 102 in the Z direction. Moreover, the memory columnar body 105 includes: a cap semiconductor layer 146 contacting an upper surface of the core insulating layer 121 and an inner side surface of the semiconductor layer 122; and a base semiconductor layer 147 contacting the upper portion of the semiconductor substrate 101 and a base of the semiconductor layer 122. In other words, an upper surface of the base semiconductor layer 147 is positioned higher than an upper surface of the conductive layer 102 which is to be the source side select gate line SGS (in the case of FIG. 5, the lowermost layer conductive layer 102). The cap semiconductor layer 146 is formed from the likes of silicon (Si), titanium (Ti), tungsten (W), nickel silicide (NiSi), cobalt silicide (CoSi), tungsten silicide (WSi), and silicon nitride (SiN), for example. The base semiconductor layer 147 is formed by epitaxial growth using silicon (Si), for example, as a material.

Moreover, the memory cell array 1 includes the block insulating layer 127 disposed between the conductive layer 102 and the inter-layer insulating layer 141 and between the memory columnar body 105 and the conductive layer 102. Formed in the memory cell array 1, so as to sandwich an arrangement region of the memory columnar body 105 in the Y direction, are a plurality of trenches 148 that have the Z direction as a depth direction and have the X direction as an extension direction. Disposed in this trench 148 is the conductive layer 108 disposed via an insulating layer 149 (not illustrated in FIG. 6). The conductive layer 108 is electrically connected to a source line 107 (not illustrated) disposed on the uppermost layer inter-layer insulating layer 141.

Furthermore, in the case of the embodiment, the upper portion of the semiconductor substrate 101 has the following in an arrangement region of the conductive layer 108, namely: an n type impurity diffusion region 181A to which a donor such as arsenic (As) and phosphorus (P) is added; and a p type impurity diffusion region 181B to which an acceptor such as boron (B) is added. The n type impurity diffusion region 181A and the p type impurity diffusion region 181B respectively contact bases of different conductive layers 108.

Now, the conductive layer 108 contacting the n type impurity diffusion region 181A will sometimes also be referred to as 108A (first connecting line), the insulating layer 149 contacting the conductive layer 108A will sometimes also be referred to as 149A, and the trench 148 filled by these conductive layer 108A and insulating layer 149A will sometimes also be referred to as 148A. The conductive layer 108 contacting the p type impurity diffusion region 181B will sometimes also be referred to as 108B (second connecting line), the insulating layer 149 contacting the conductive layer 108B will sometimes also be referred to as 149B, and the trench 148 filled by these conductive layer 108B and insulating layer 149B will sometimes also be referred to as 148B. The n type impurity diffusion region 181A and the p type impurity diffusion region 181B will sometimes also be collectively referred to simply as "impurity diffusion region 181".

In the case of the embodiment, as shown in FIG. 5, the conductive layer 108A has a bottom surface whose depth in the Z direction with respect to the upper surface of the semiconductor substrate 101 is shallower than that of the conductive layer 108B. However, the bottom surfaces of both the conductive layers 108A and 108B remain in the impurity diffusion region 181.

In addition, the memory cell array 1 has a plurality of the conductive layers 108 arranged in the Y direction therein, but of those plurality of conductive layers 108, the proportion of conductive layers 108A is larger than the proportion of conductive layers 108B. In other words, more of the conductive layers 108A are disposed than the conductive layers 108B. In the case of FIG. 6, one conductive layer 108B is disposed every four conductive layers 108A. In other words, the semiconductor substrate 101 has more n type impurity diffusion regions 181A than p type impurity diffusion regions 181B, and in the case of FIG. 6, one p type impurity diffusion region 181B is formed every four n type impurity diffusion regions 181A. Thus, in the case of the embodiment, the impurity diffusion region 181 which is to be a supply source of charge is formed at a place of contact with the conductive layer 108 of the semiconductor substrate 101. In other words, in the case of the embodiment, charge can be supplied from a place comparatively close to the memory cell MC, hence supply of charge to the charge accumulation layer 125 during the write operation and the erase operation becomes easy. Note that in the embodiment, percentages of the n type impurity diffusion regions 181A and the p type impurity diffusion regions 181B are arbitrary. In the case of FIG. 6, in view of the fact that there are more write operations than erase operations, a larger number of n type impurity diffusion regions 181A which are supply sources of electrons, are formed.

Moreover, in the case of the embodiment, an oxide portion 182 is formed close to the place of contact with the conductive layer 108 of the impurity diffusion region 181 of the semiconductor substrate 101. Now, the oxide portion 182 formed in the n type impurity diffusion region 181A will sometimes also be referred to as 182A, and the oxide portion 182 formed in the p type impurity diffusion region 181B will sometimes also be referred to as 182B. An oxide portion 147a is formed between from a lower surface to an upper surface of the lowermost layer conductive layer 102 in the Z direction of a side surface of the base semiconductor layer 147. Of these, the oxide portion 182A formed in the n type impurity diffusion region 181A has a thickness in the Z direction which is larger than that of the oxide portion 182B formed in the p type impurity diffusion region 181B.

Next, a method of manufacturing the memory cell array 1 will be described.

FIGS. 7 to 15 are cross-sectional views explaining manufacturing steps of the memory cell array in the semiconductor memory device according to the embodiment. FIGS. 7 to 15 are cross-sectional views in the Y-Z directions of the memory region 1a of the memory cell array 1.

Figure 7:
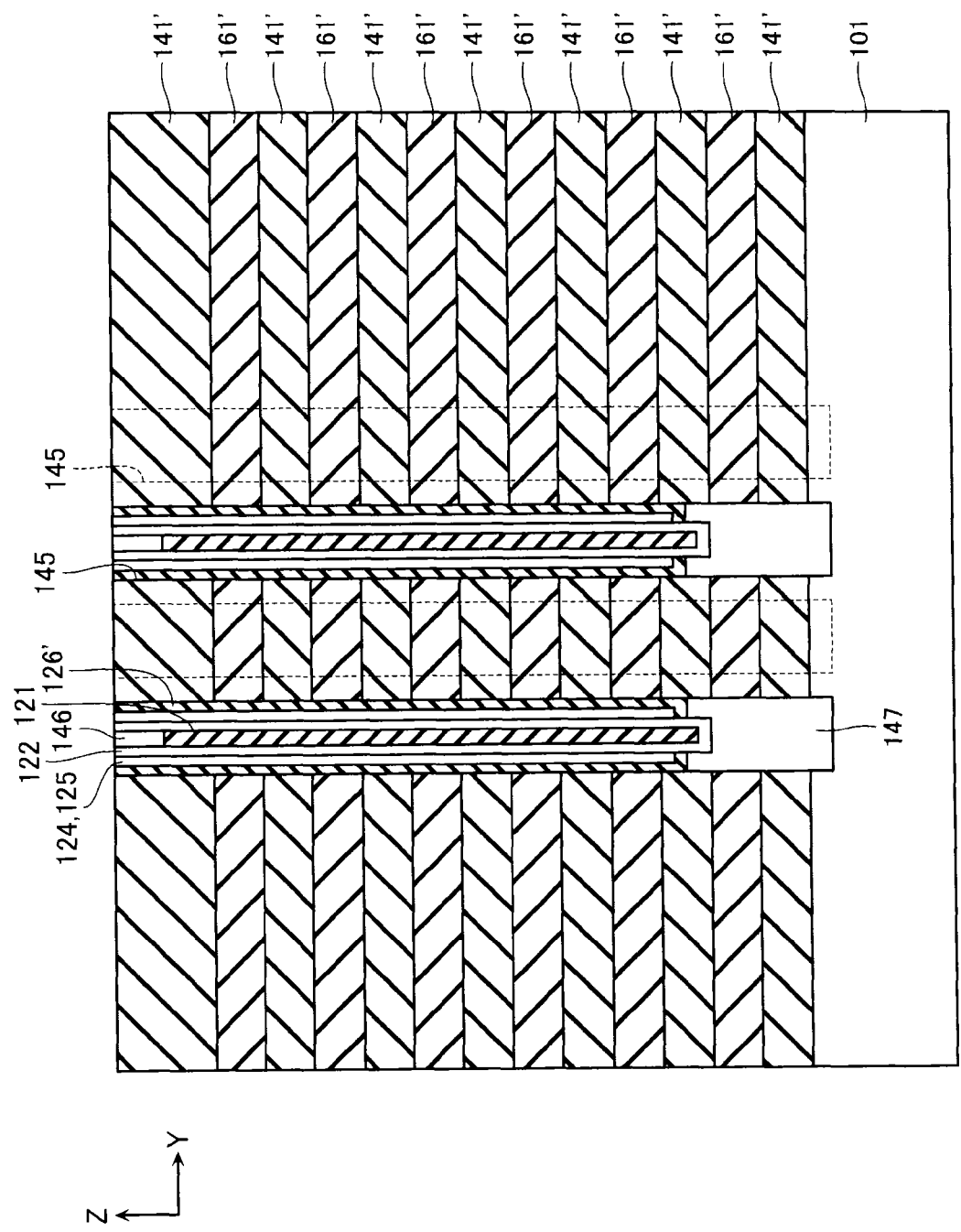
FIGS. 7 to 15 are cross-sectional views explaining manufacturing steps of the memory cell array in the semiconductor memory device according to the embodiment.

Formation of a structure shown in FIG. 7 is as follows. That is, an inter-layer insulating layer 141" and a sacrifice layer 161" are stacked in plurality alternately on the semiconductor substrate 101. Now, the inter-layer insulating layer 141" is formed from the likes of silicon oxide (SiO$_2$), for example. Moreover, the sacrifice layer 161" is formed from the likes of silicon nitride (SiN), for example. Next, in the memory region 1a of the memory cell array 1, a plurality of through holes 145 extending in the Z direction are formed in the inter-layer insulating layer 141" and the sacrifice layer 161". Now, employed in formation of the through hole 145 are, for example, lithography and dry etching. As a result, the inter-layer insulating layer 141" and the sacrifice layer 161' become an inter-layer insulating layer 141' and a sacrifice layer 161'. The through hole 145 becomes the memory hole 145. Next, a base semiconductor layer 147' is deposited in the through hole 145 for backfilling of a material of the semiconductor substrate 101 removed by etching of the through hole 145. The base semiconductor layer 147' is formed by epitaxial growth using silicon (Si), for example, as a material. Next, a cover insulating layer 126", a charge accumulation layer 125', and a tunnel insulating layer 124' are deposited sequentially on a side surface of the through hole 145. Now, the tunnel insulating layer 124' is formed from the likes of silicon oxide (SiO$_2$), for example. The charge accumulation layer 125' is formed from a material capable of charge accumulation, such as silicon nitride (SiN), for example. The cover insulating layer 126" is formed from the likes of silicon oxide (SiO$_2$), for example. Next, bases of the cover insulating layer 126", the charge accumulation layer 125', and the tunnel insulating layer 124' are removed until an upper surface of the base semiconductor layer 147' is exposed. As a result, the tunnel insulating layer 124', the charge accumulation layer 125', the cover insulating layer 126", and the base semiconductor layer 147' become the tunnel insulating layer 124, the charge accumulation layer 125, a cover insulating layer 126', and the base semiconductor layer 147. Next, the semiconductor layer 122 is deposited on an inner side surface of the tunnel insulating layer 124 so as to contact the base semiconductor layer 147. Now, the semiconductor layer 122 is formed from the likes of silicon (Si), for example. Next, a void of the semiconductor layer 122 is buried with the core insulating layer 121, and then the cap semiconductor layer 146 contacting an upper surface of the core insulating layer 121 and an inner side surface of the semiconductor layer 122, is deposited. Now, the core insulating layer 121 is formed from the likes of silicon oxide (SiO$_2$), for example. The cap semiconductor layer 146 is formed from, for example, silicon (Si), titanium (Ti), tungsten (W), nickel silicide (NiSi), cobalt silicide (CoSi), tungsten silicide (WSi), or silicon nitride (SiN). Steps thus far result in formation of the structure shown in FIG. 7.

Figure 8:
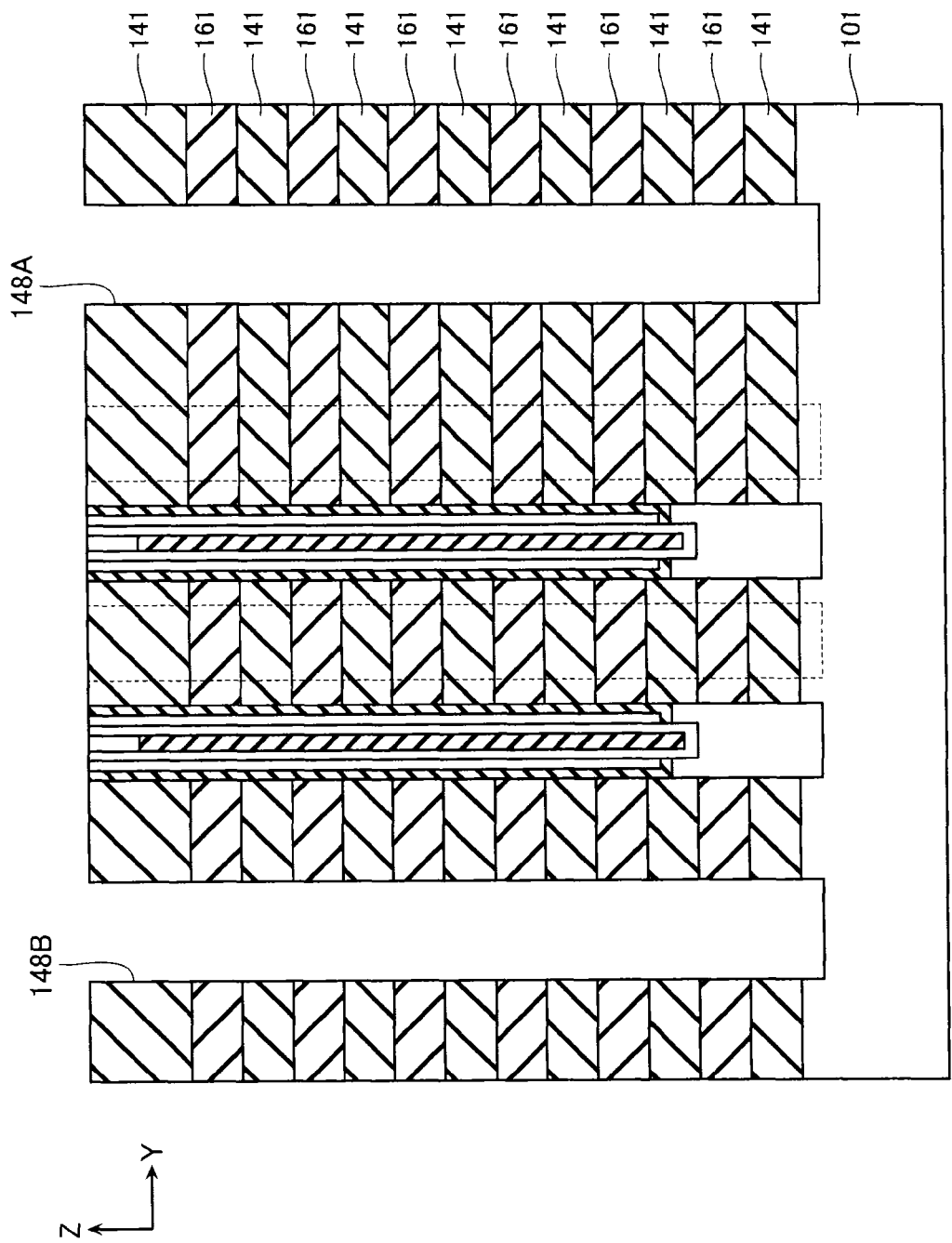

As shown in FIG. 8, the plurality of trenches 148 having the Z direction as a depth direction and having the X direction as an extension direction are formed in the inter-layer insulating layer 141' and the sacrifice layer 161'. As a result, the inter-layer insulating layer 141' and the sacrifice layer 161' become the inter-layer insulating layer 141 and the sacrifice layer 161.

Figure 9:
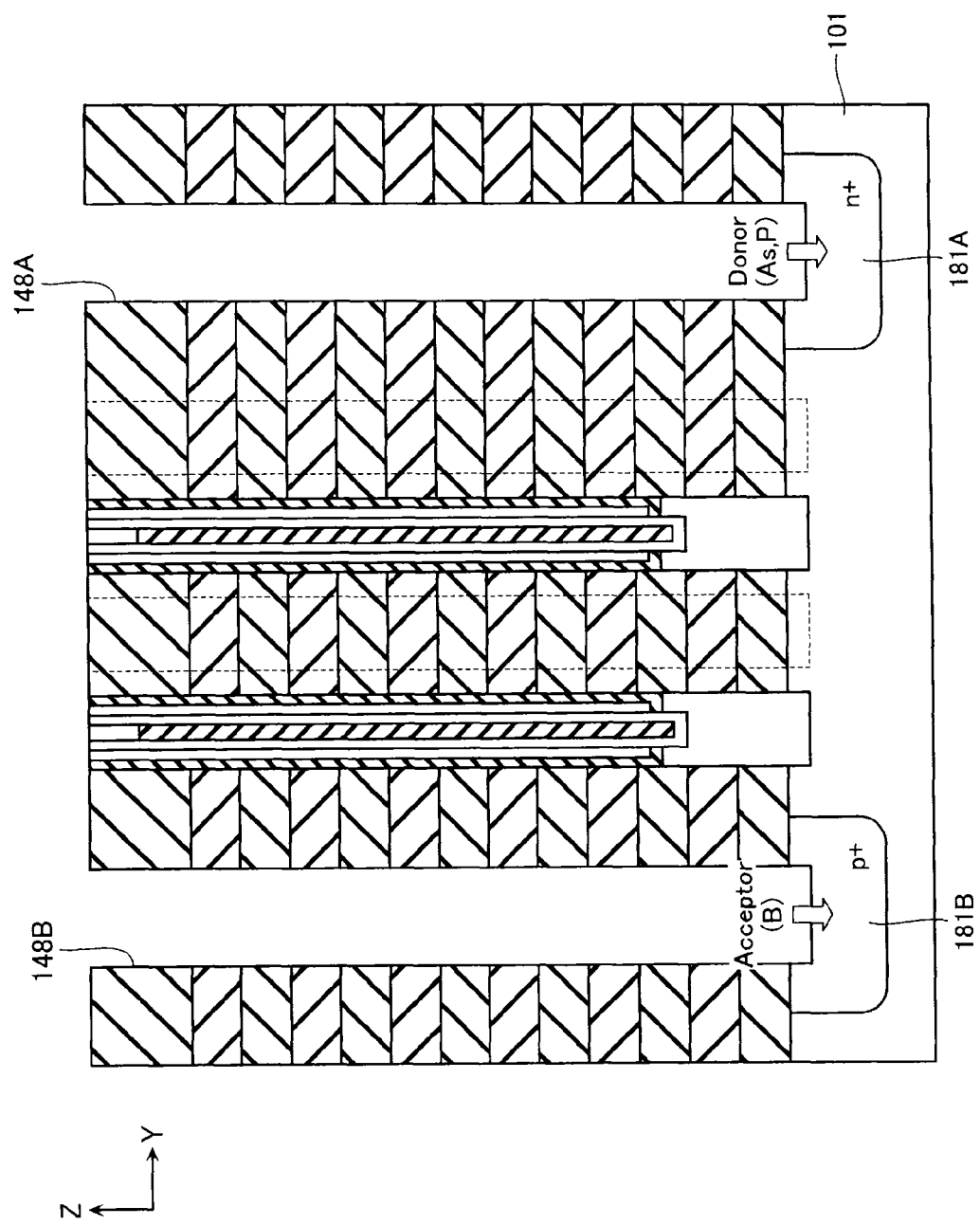

As shown in FIG. 9, the n type impurity diffusion region 181A is formed in a portion exposed in the trench 148A of the semiconductor substrate 101, by, for example, lithography and implantation of a donor such as arsenic (As) and phosphorus (P). On the other hand, the p type impurity diffusion region 181B is formed in a portion exposed in the trench 148B of the semiconductor substrate 101, by, for example, lithography and implantation of an acceptor such as boron (B).

Figure 10:
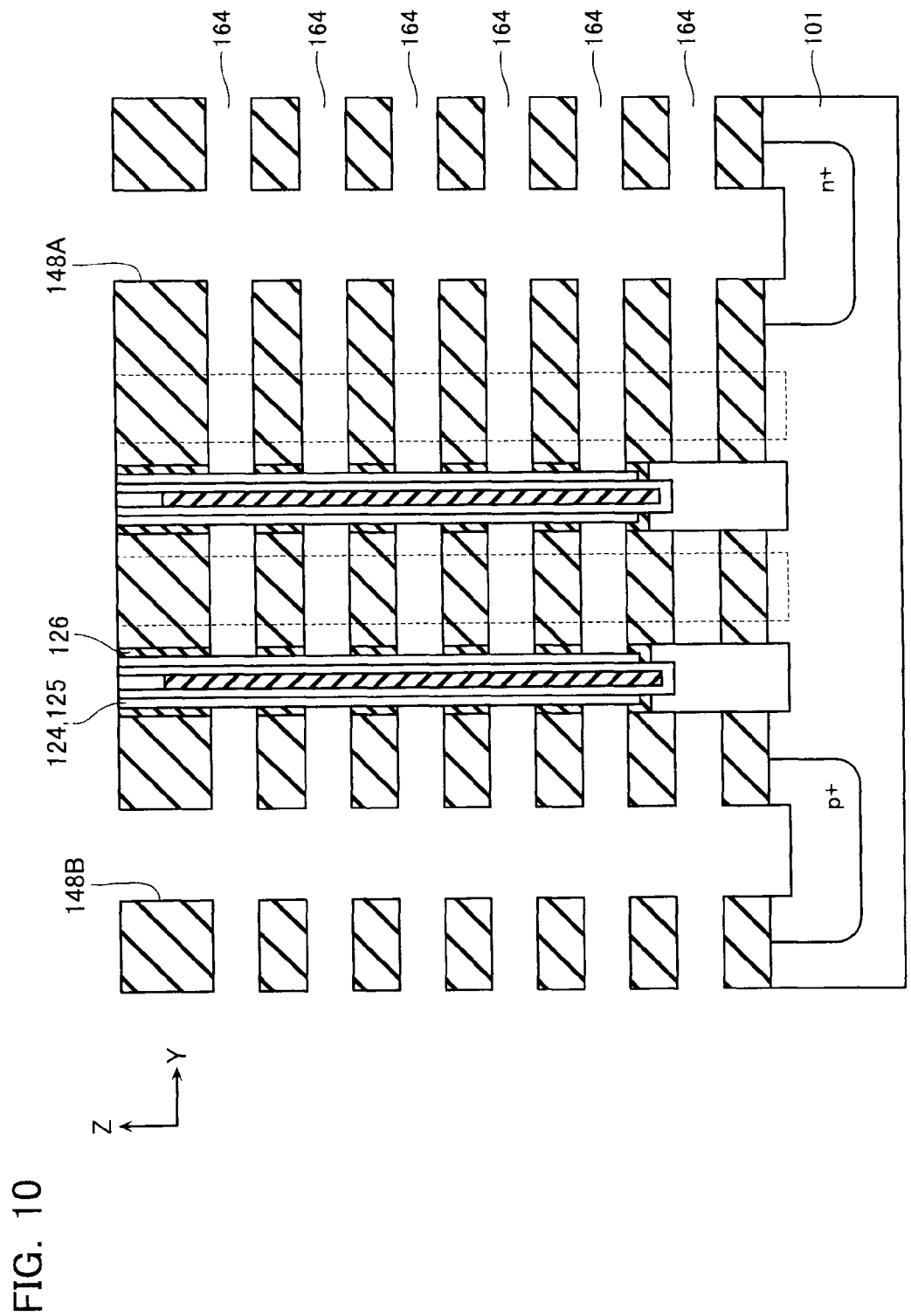

As shown in FIG. 10, the sacrifice layer 161 is removed via the trench 148. As a result, a gap 164 is formed at a position where the sacrifice layer 161 was. The memory columnar body 105 is exposed in the gap 164. Next, a portion exposed in the gap 164 of the cover insulating layer 126' is removed via the trench 148. As a result, the cover insulating layer 126' becomes the cover insulating layer 126 divided at a position of the gap 164 in the Z direction. Moreover, the charge accumulation layer 125 is exposed at a place of division of the cover insulating layer 126.

Figure 11:
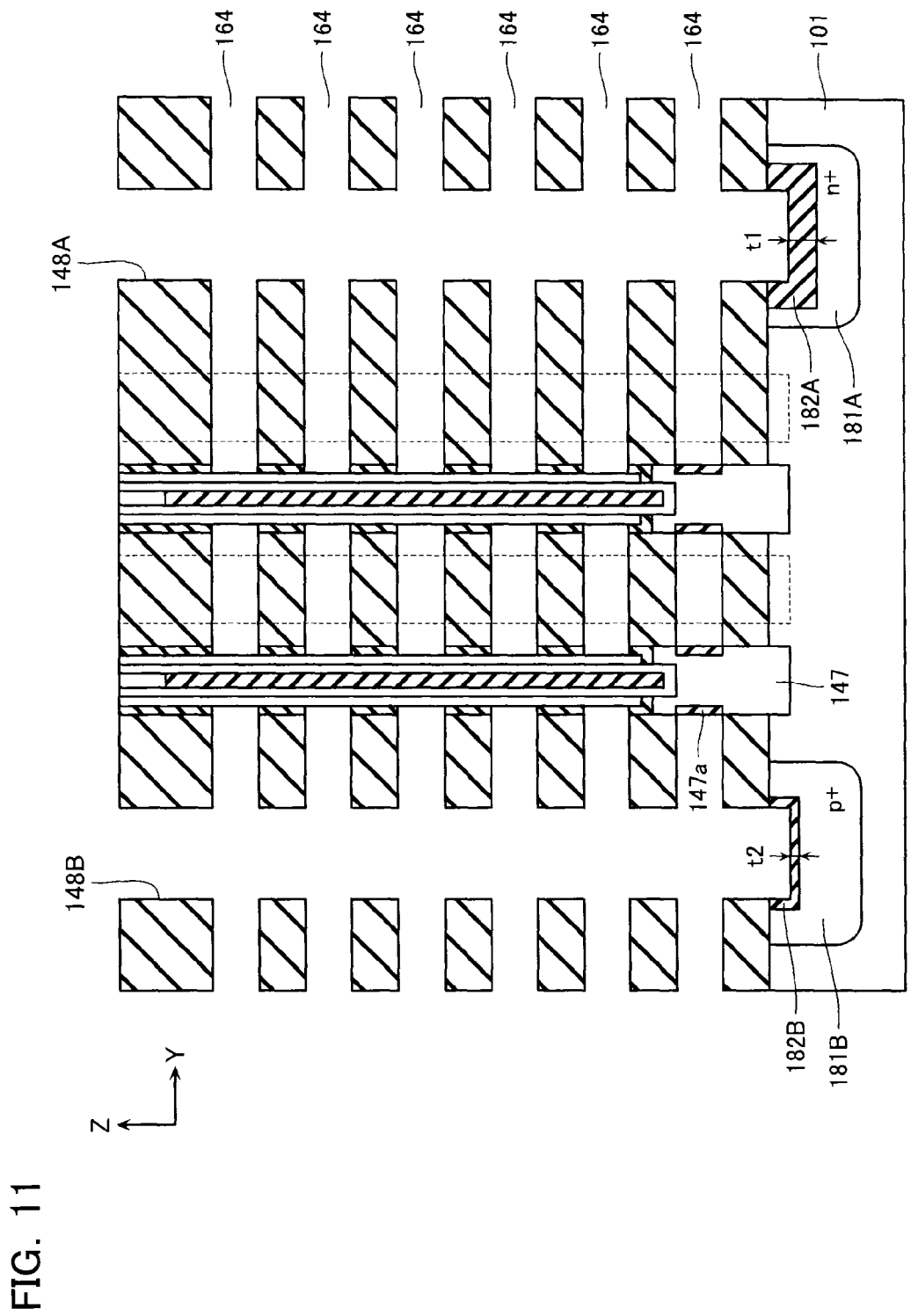

As shown in FIG. 11, a semiconductor material exposed in the trench 148 and the gap 164 is oxidized by hydrogen combustion oxidation. As a result, the oxide portion 182 is formed close to the trench 148 of the impurity diffusion region 181. At this time, a thickness t1 in the Z direction of the oxide portion 182A of the n type impurity diffusion region 181A becomes larger than a thickness t2 in the Z direction of the oxide portion 182B of the p type impurity diffusion region 181B. This is because oxidation speed of hydrogen combustion oxidation on an n type semiconductor is faster than oxidation speed of hydrogen combustion oxidation on a p type semiconductor. In addition, the oxide portion 147a is formed also in a portion exposed in the gap 164 of the base semiconductor layer 147.

Figure 12:
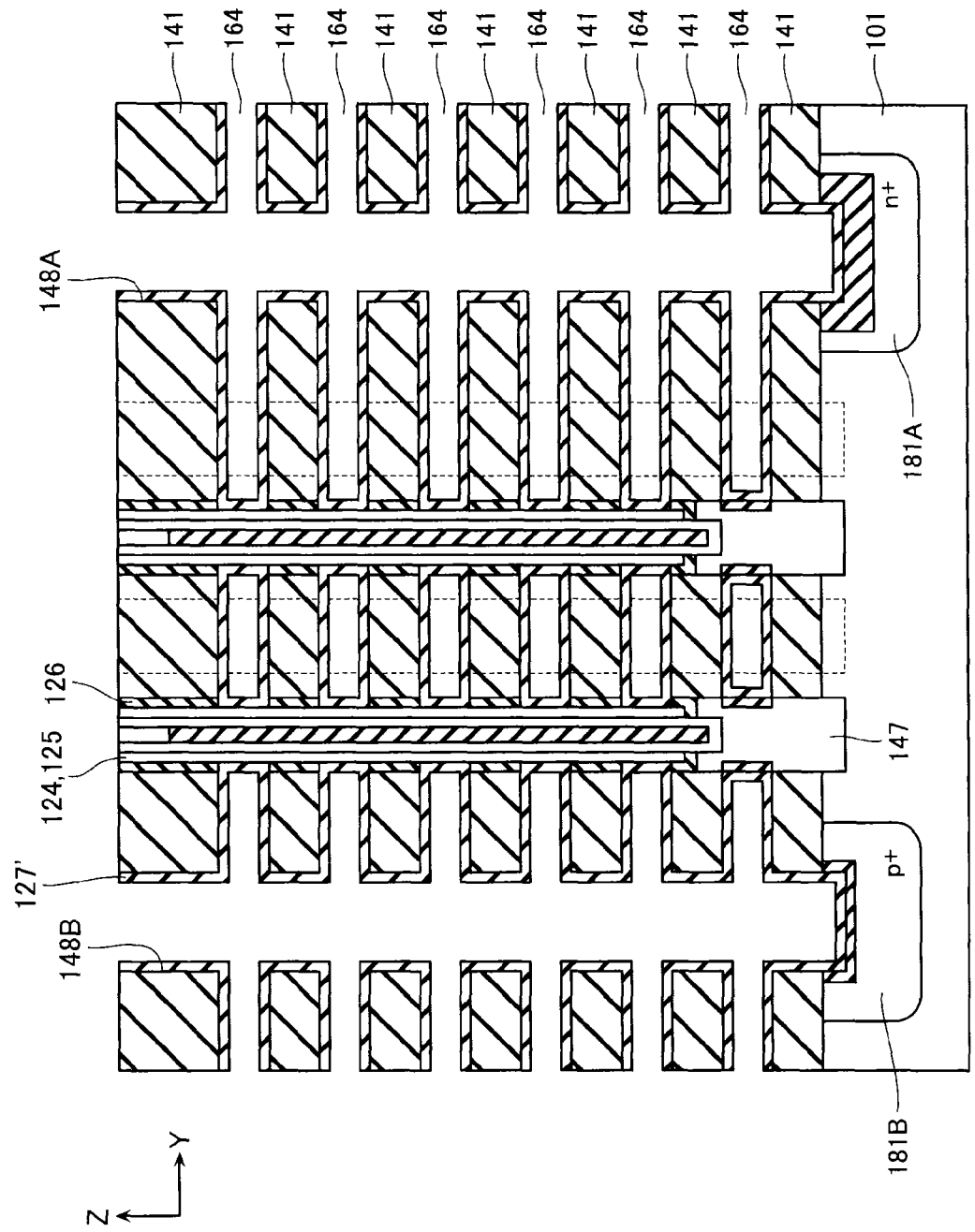

As shown in FIG. 12, a block insulating layer 127' is deposited, via the trench 148, on outer side surfaces of the charge accumulation layer 125 and the base semiconductor layer 147 exposed in the gap 164. At this time, the block insulating layer 127' is deposited also on a lower surface, upper surface, and side surface of the inter-layer insulating layer 141 and an upper surface of the impurity diffusion region 181. Now, the block insulating layer 127' is formed from the likes of silicon oxide (SiO$_2$), for example.

Figure 13:
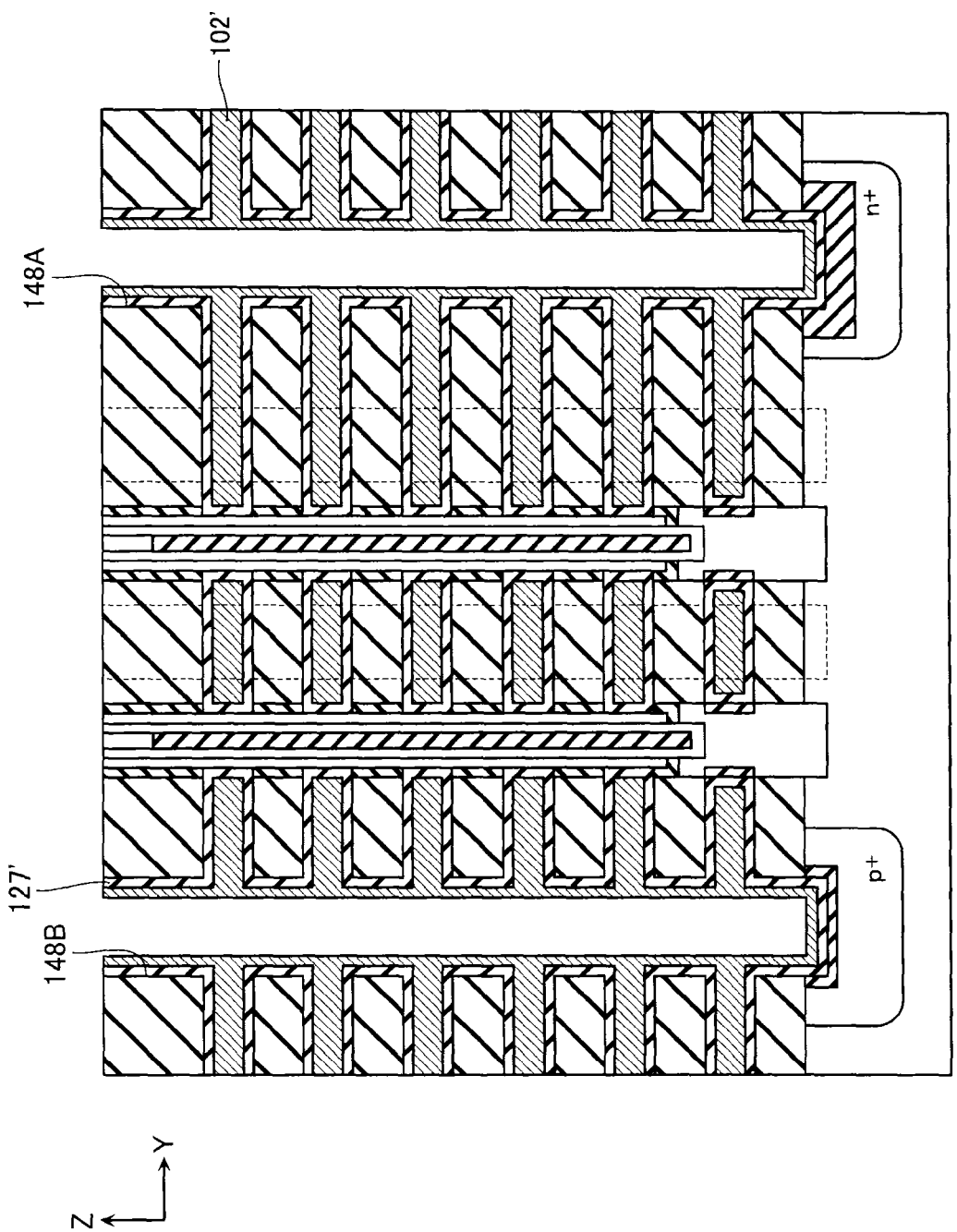

As shown in FIG. 13, a conductive layer 102' is deposited, via the trench 148, on an outer surface of the block insulating layer 127', whereby the gap 164 is filled. Now, the conductive layer 102' is formed from the likes of tungsten (W), for example.

Figure 14:
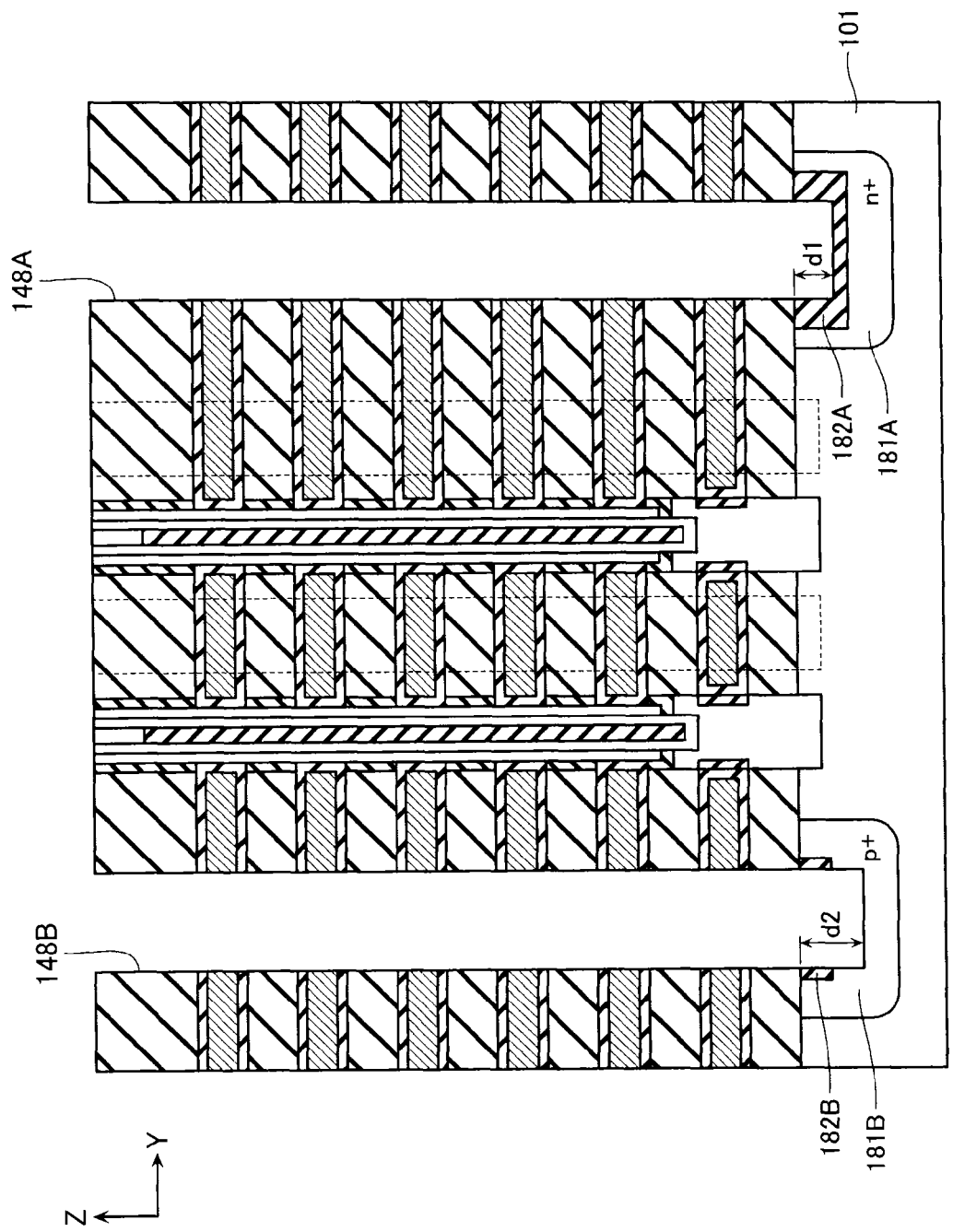

As shown in FIG. 14, portions inside the trench 148 of the conductive layer 102' and the block insulating layer 127' are removed by dry etching, and so on. As a result, the conductive layer 102' and the block insulating layer 127' become the conductive layer 102 and the block insulating layer 127. At this time, a part of the impurity diffusion region 181 below the trench 148 of the semiconductor substrate 101 also gets over-etched. However, in the case of the embodiment, the oxide portion 182 formed in an upper portion of the impurity diffusion region 181 acts as an etching stopper, hence an etching amount of the impurity diffusion region 181 is suppressed. Specifically, because the thickness t1 (refer to FIG. 11) of the oxide portion 182A is larger than the thickness t2 (refer to FIG. 11) of the oxide portion 182B, the etching amount of the n type impurity diffusion region 181A becomes smaller than the etching amount of the p type impurity diffusion region 181B. In other words, a depth d1 of a bottom surface with respect to an upper surface of the semiconductor substrate 101, of the trench 148A becomes shallower than a depth d2 of a bottom surface with respect to the upper surface of the semiconductor substrate 101, of the trench 148B.

Figure 15:
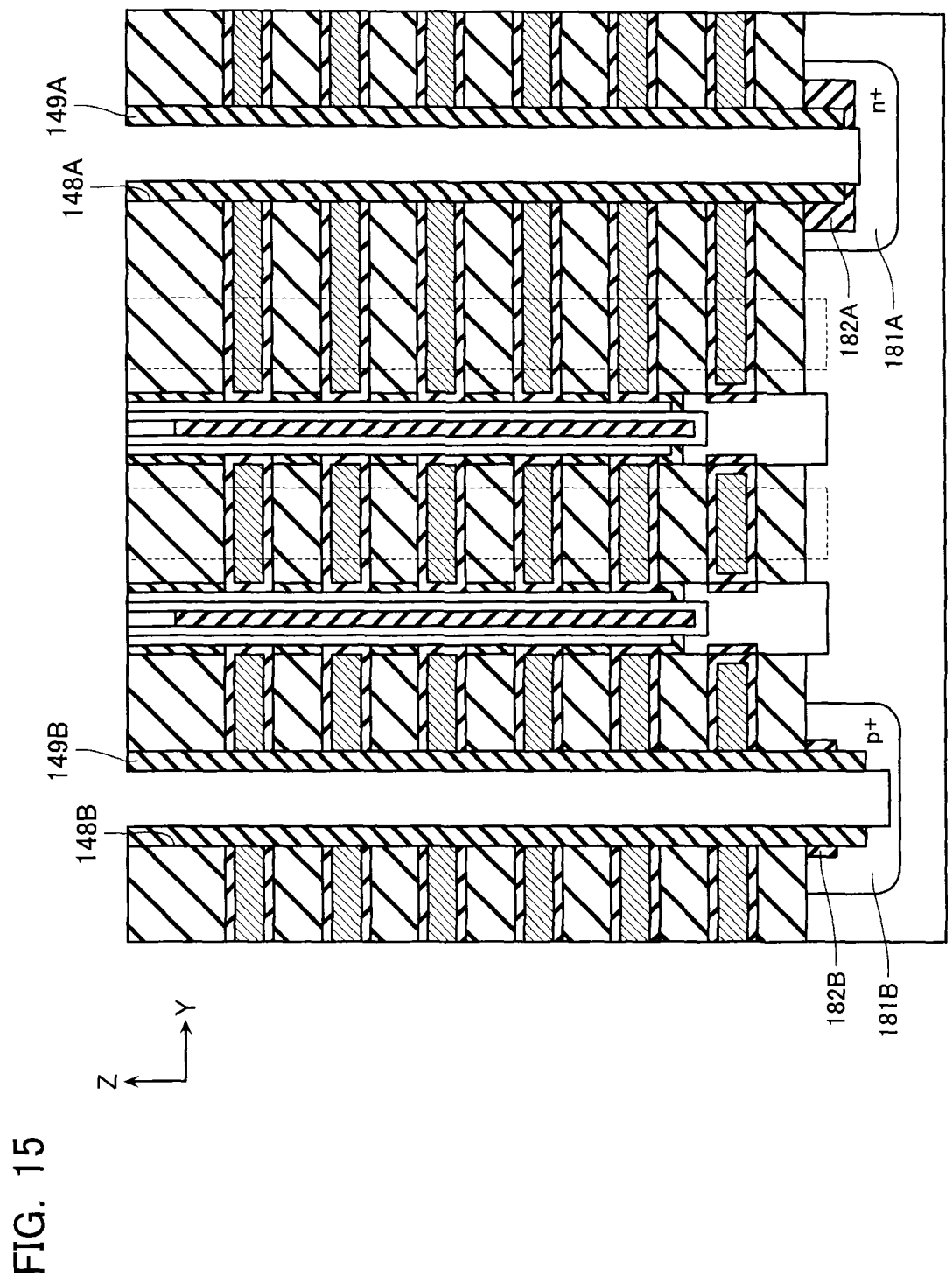

As shown in FIG. 15, the insulating layer 149 is deposited on a side surface of the trench 148, and then a portion in a base of the trench 148 of the insulating layer 149 is etched back. Now, the insulating layer 149 is formed from the likes of silicon oxide (SiO$_2$), for example. At this time, the trench 148 gets even more deeply dug down by over-etching. However, because an overall etching amount in the step shown in FIG. 14 and the present step is suppressed by action of the oxide portion 182, it becomes easy for the bottom surface of the trench 148 to remain inside the impurity diffusion region 181. Specifically, because the oxide portion 182A is formed more thickly in the Z direction than the oxide portion 182B, a depth in the Z direction with respect to the upper surface of the semiconductor substrate 101, of the trench 148A becomes shallower than that of the trench 148B. Finally, the conductive layer 108 is deposited in the trench 148 where the insulating layer 149 is deposited. Now, the conductive layer 108 is formed from the likes of tungsten (W), for example.

The above steps result in formation of the memory cell array 1 shown in FIGS. 5 and 6.

Next, advantages of the embodiment will be described using a method of manufacturing a memory cell array according to a comparative example.

FIGS. 16 to 20 are cross-sectional views explaining manufacturing steps of the memory cell array in a semiconductor memory device according to the comparative example. FIGS. 16 to 20 are cross-sectional views in the Y-Z directions of a memory region of the memory cell array.

Up to removal of a sacrifice layer 261 (corresponding to 161) is performed by steps similar to the steps shown in FIGS. 7 to 10. Note that in the case of the comparative example, oxidation of the semiconductor material by WVG shown in FIG. 11 is not performed.

Figure 16:
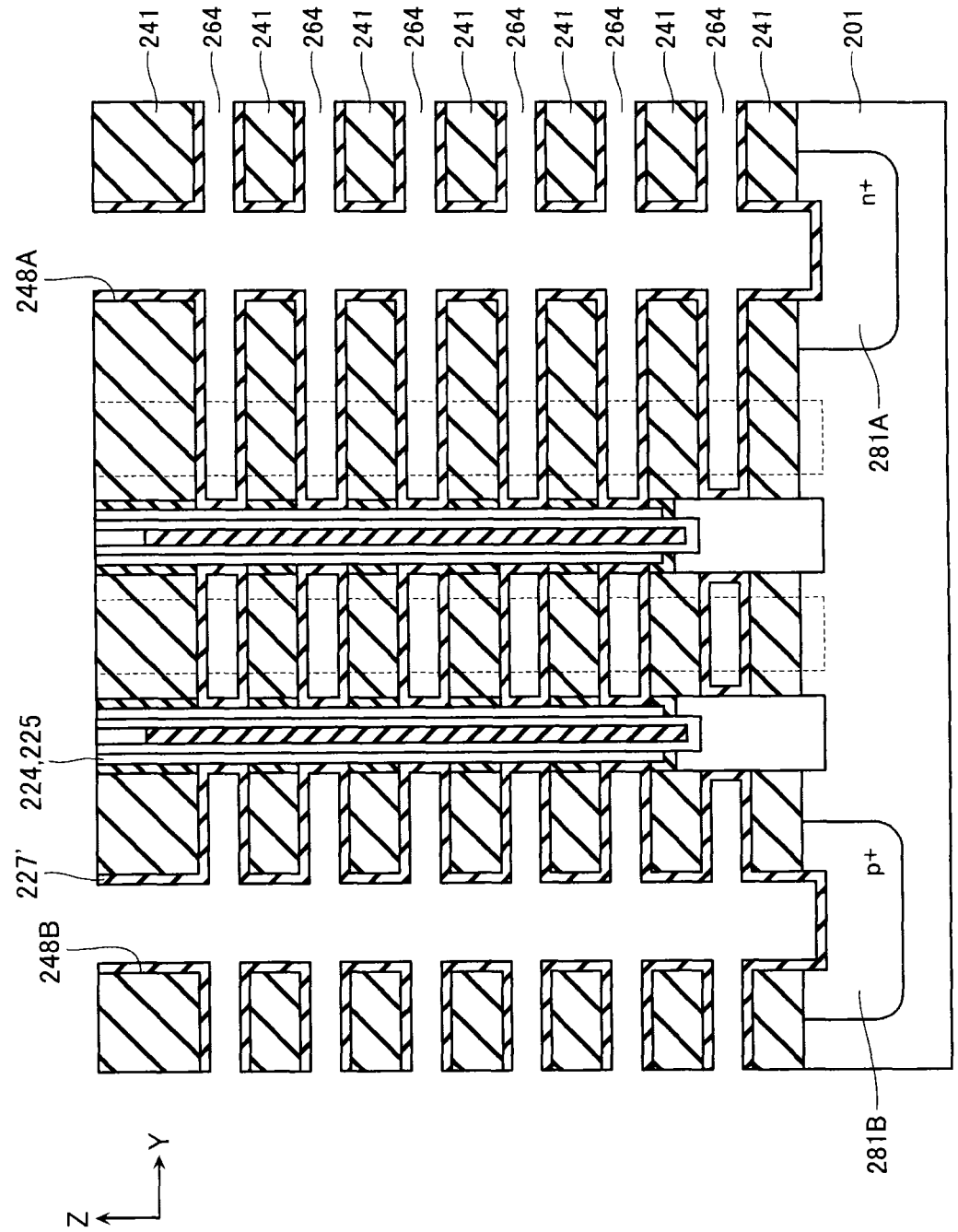
FIGS. 16 to 20 are cross-sectional views explaining manufacturing steps of a memory cell array in a semiconductor memory device according to a comparative example.

As shown in FIG. 16, a block insulating layer 227' (corresponding to 127') is deposited, via a trench 248 (corresponding to 148), on outer side surfaces of a charge accumulation layer 225 (corresponding to 125) and a base semiconductor layer 247 (corresponding to 147) exposed in a gap 264 (corresponding to 164). At this time, the block insulating layer 227' is deposited also on a lower surface, upper surface, and side surface of an inter-layer insulating layer 241 (corresponding to 141) and an upper surface of an impurity diffusion region 281 (corresponding to 181).

Figure 17:
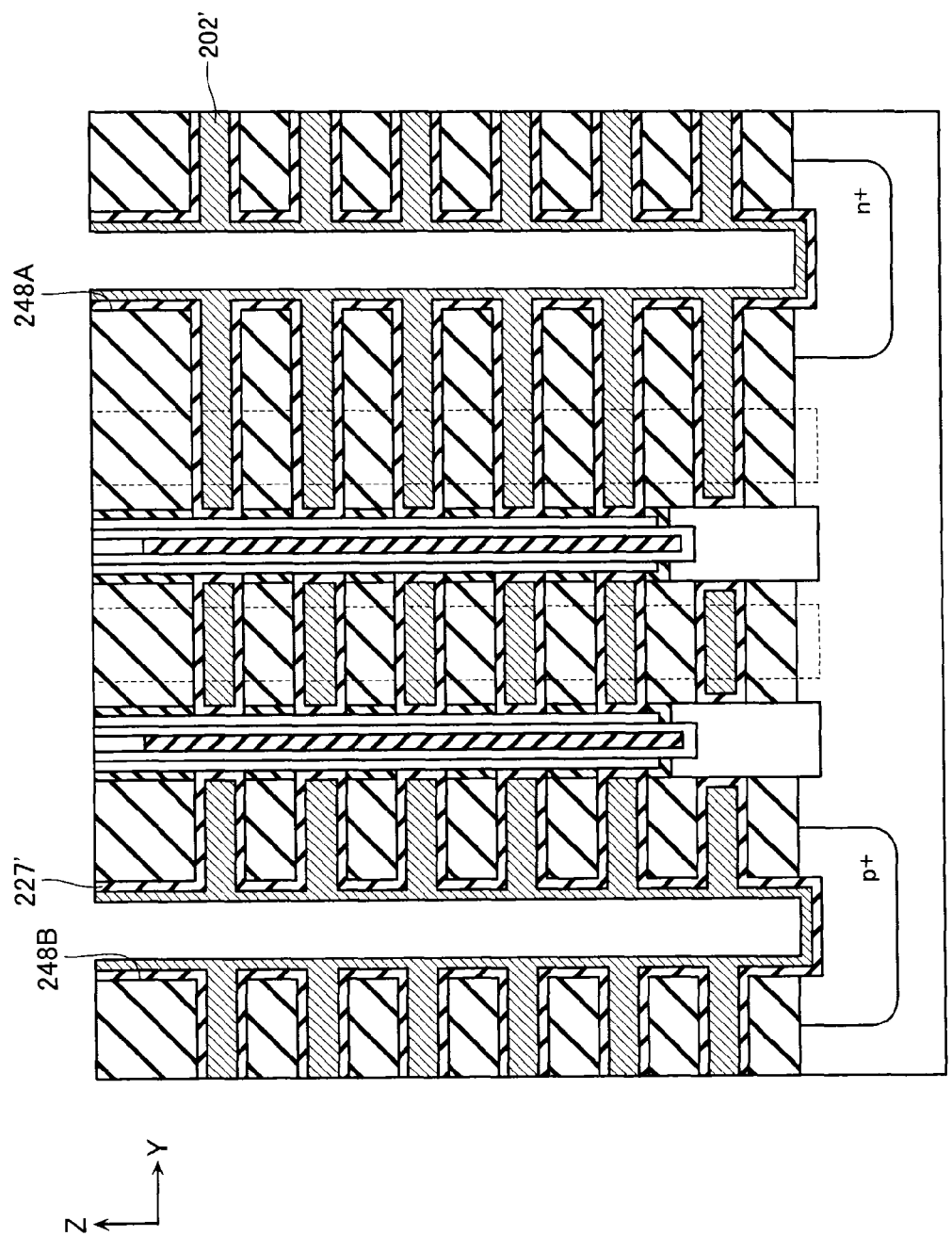

As shown in FIG. 17, a conductive layer 202' (corresponding to 102') is deposited, via the trench 248, on an outer surface of the block insulating layer 227', and the gap 264 is filled.

Figure 18:
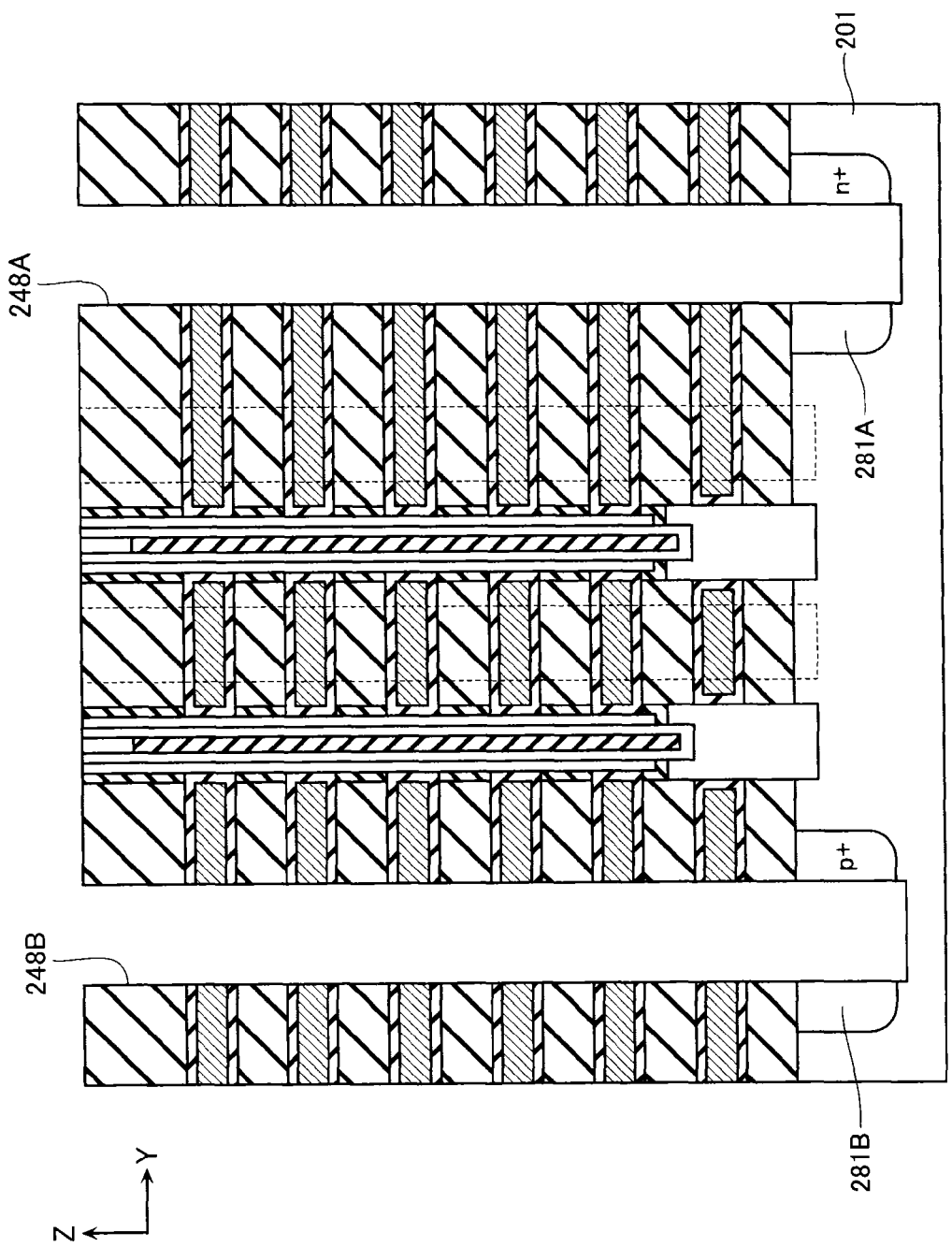

As shown in FIG. 18, portions inside the trench 248 of the conductive layer 202' and the block insulating layer 227' are removed by dry etching, and so on. At this time, a part of the impurity diffusion region 281A below the trench 248 of a semiconductor substrate 201 (corresponding to 101) also gets over-etched. Moreover, in the case of the comparative example, because an oxide portion is not formed in an upper portion of the semiconductor substrate 201 as in the embodiment, an etching amount of the semiconductor substrate 201 becomes larger compared to the embodiment. Therefore, in the worst case, as shown in FIG. 18, the trench 248 ends up breaking through the impurity diffusion region 281.

Figure 19:
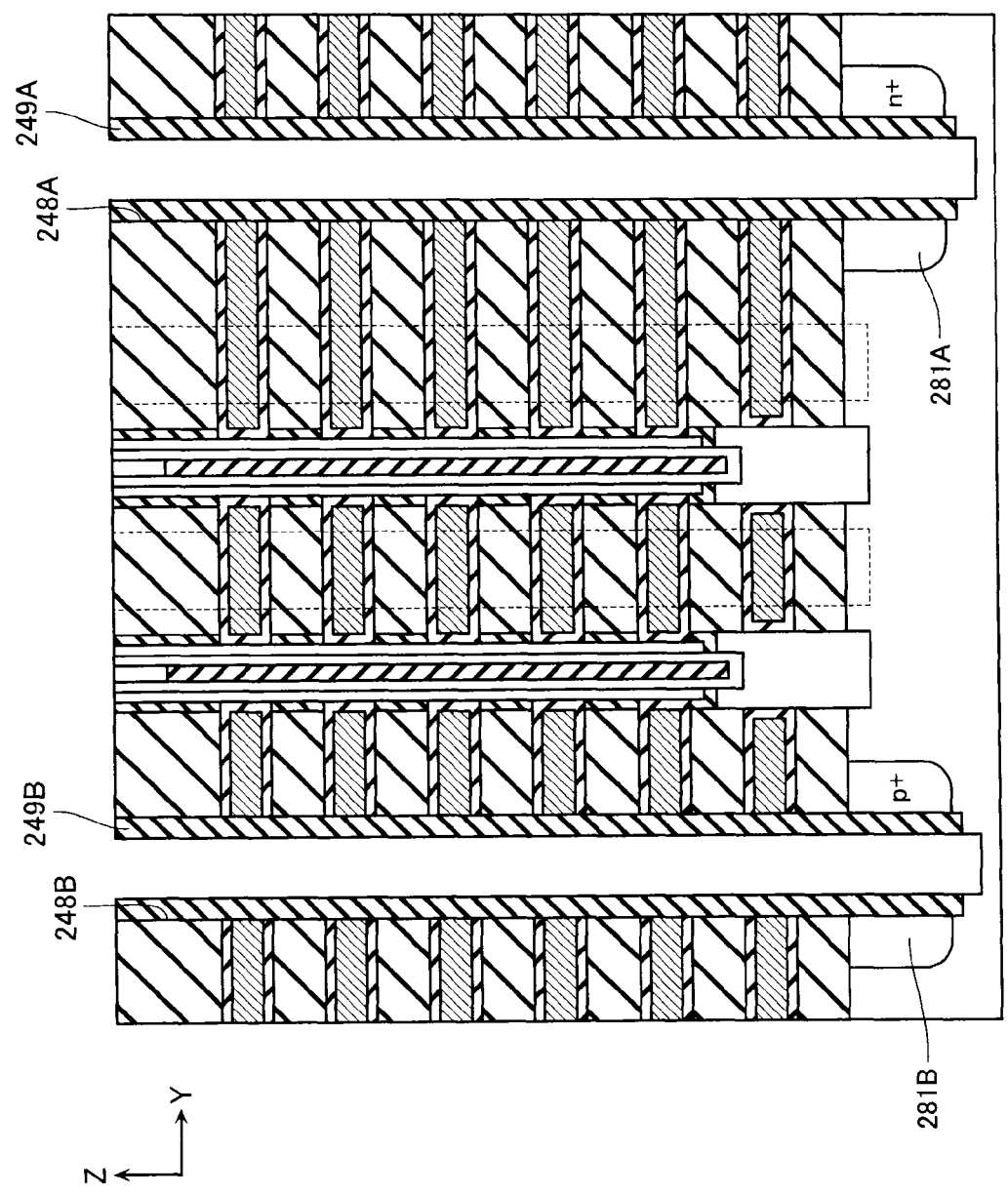

As shown in FIG. 19, an insulating layer 249 (corresponding to 149) is deposited on a side surface of the trench 248, and then a portion in a base of the trench 248 of the insulating layer 249 is etched back. At this time, the trench 248 gets even more deeply dug down by over-etching. Therefore, even if abase of the trench 248 has remained inside the impurity diffusion region 281 as a result of the step shown in FIG. 18, the trench 248 ends up breaking through the impurity diffusion region 281 comparatively easily as a result of the present step.

Figure 20:
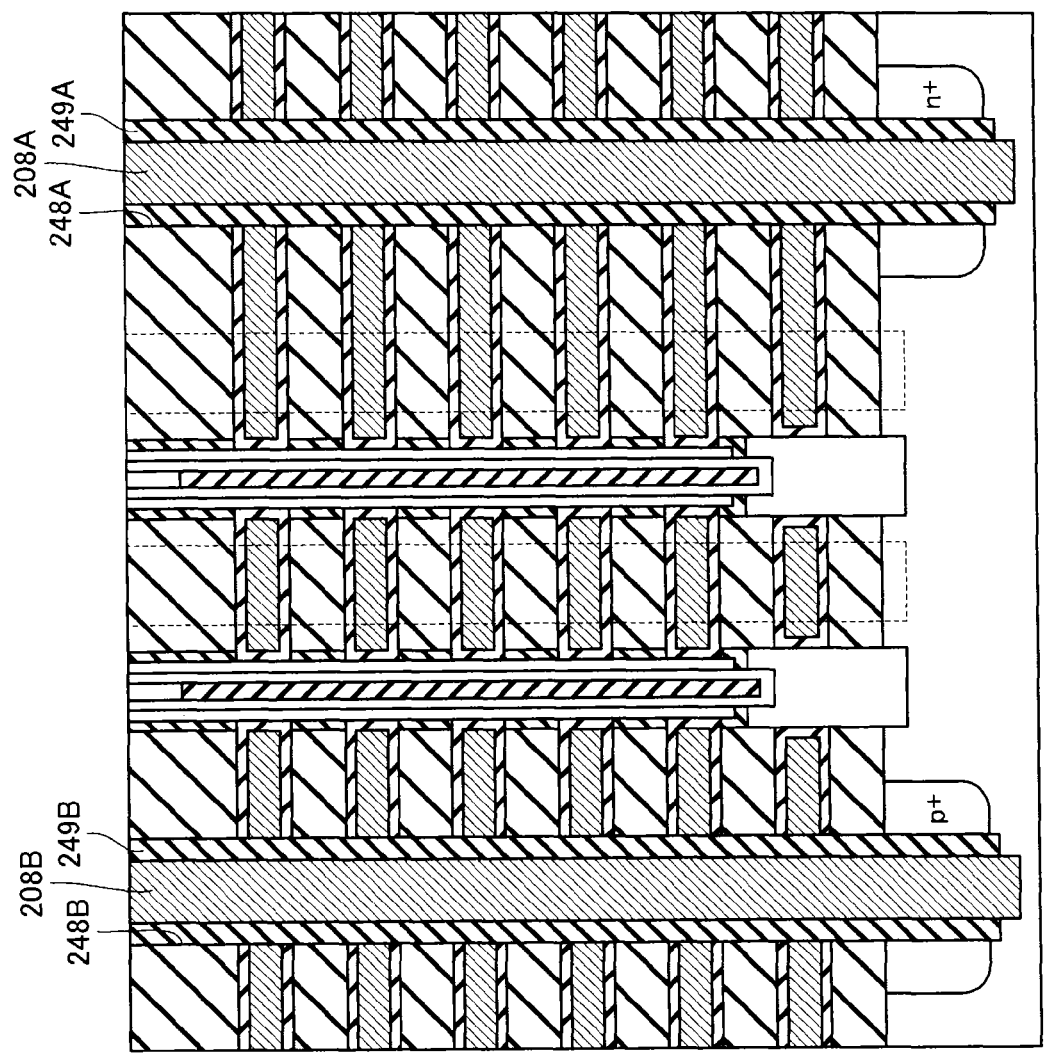

As shown in FIG. 20, when a conductive layer 208 (corresponding to 108) is deposited in the trench 248 where the insulating layer 249 is deposited, the memory cell array according to the comparative example is formed.

As described above, in the case of the comparative example, the semiconductor substrate 201 does not have an oxide portion at a position of the trench 248 of its upper portion. As a result, in the case of the comparative example, there is no suppression effect of the etching amount due to the oxide portion as in the embodiment, hence, in comparison to the case of the embodiment, the trench 248 ends up breaking out from the impurity diffusion region 281 comparatively easily as a result of the steps shown in FIGS. 18 and 19. This leads to a problem that contact resistance between the semiconductor substrate 201 and the conductive layer 208 ends up increasing.

In this regard, the embodiment has the oxide portion 182 formed in the upper portion of the semiconductor substrate 101 by hydrogen combustion oxidation. As a result, the etching amount of the semiconductor substrate 101 occurring during the steps shown in FIGS. 14 and 19 can be reduced. Therefore, the possibility of the trench 148 breaking through the impurity diffusion region 181 can be reduced more compared to in the comparative example. Furthermore, because the oxide portion 147a is formed on the side surface of the base semiconductor layer 147 by hydrogen combustion oxidation, reliability of a gate insulating layer of the source side select transistor STS can be improved more than in the case of the comparative example in which the gate insulating layer of the source side select transistor STS is configured by the block insulating layer 227 only.

In other words, the embodiment makes it possible to provide a semiconductor memory device in which reliability of an access operation is improved by reduction of contact resistance of the source contact LI (conductive layer 108) and the semiconductor substrate 101 and improvement of reliability of the gate insulating layer of the source side select transistor STS.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array, the memory cell array including: a conductive layer stacked on a semiconductor substrate; an inter-layer insulating layer disposed on the conductive layer; a conductive line disposed on the inter-layer insulating layer; a first connecting line and a second connecting line that contact the semiconductor substrate and are electrically connected to the conductive line and that at least extend in a stacking direction of the conductive layer and the inter-layer insulating layer; and a columnar body that penetrates the conductive layer and the inter-layer insulating layer in the stacking direction between the first connecting line and the second connecting line and that includes a first semiconductor layer,
the semiconductor substrate having: a first impurity region to which a first impurity is added at a place of contact with the first connecting line; and a second impurity region to which a second impurity different from the first impurity is added at a place of contact with the second connecting line.

2. The semiconductor memory device according to claim 1, wherein
the memory cell array includes more of the first connecting lines than the second connecting lines.

3. The semiconductor memory device according to claim 1, wherein
the semiconductor substrate has more of the first impurity regions than the second impurity regions.

4. The semiconductor memory device according to claim 1, wherein
the first impurity is a donor, and
the second impurity is an acceptor.

5. The semiconductor memory device according to claim 4, wherein
the first impurity is arsenic or phosphorus.

6. The semiconductor memory device according to claim 4, wherein
the second impurity is boron.

7. The semiconductor memory device according to claim 1, wherein
the first connecting line has a bottom surface whose depth in the stacking direction with respect to an upper surface of the semiconductor substrate is shallower than that of the second connecting line.

8. The semiconductor memory device according to claim 7, wherein
the first connecting line and the second connecting line are plate-like conductors having a principal plane along the stacking direction.

9. The semiconductor memory device according to claim 7, wherein
the columnar body includes a second semiconductor layer that contacts the first semiconductor layer and the semiconductor substrate.

10. The semiconductor memory device according to claim 9, wherein
the second semiconductor layer has an upper surface which is higher than an upper surface of the conductive layer in the stacking direction.

11. The semiconductor memory device according to claim 9, wherein
the second semiconductor layer has a side surface which is oxidized between from a lower surface to an upper surface of the conductive layer in the stacking direction.

12. The semiconductor memory device according to claim 9, wherein
the memory cell array includes a block insulating layer disposed between an upper surface of the conductive layer and a lower surface of the inter-layer insulating layer and between a side surface of the conductive layer and a side surface of the second semiconductor layer.

13. The semiconductor memory device according to claim 7, wherein
the semiconductor substrate has: a first oxide portion formed at a place of contact with the first connecting line; and a second oxide portion formed at a place of contact with the second connecting line, and
the first oxide portion has a thickness in the stacking direction which is greater than that of the second oxide portion.

14. A semiconductor memory device, comprising:
a memory cell array, the memory cell array including: a conductive layer stacked on a semiconductor substrate; an inter-layer insulating layer disposed on the conductive layer; a conductive line disposed on the inter-layer insulating layer; a first connecting line and a second connecting line that contact the semiconductor substrate and are electrically connected to the conductive line and that at least extend in a stacking direction of the conductive layer and the inter-layer insulating layer; and a columnar body that penetrates the conductive layer and the inter-layer insulating layer in the stacking direction between the first connecting line and the second connecting line and that includes a first semiconductor layer,
the semiconductor substrate having: a first oxide portion formed at a place of contact with the first connecting line; and a second oxide portion formed at a place of contact with the second connecting line, and
the first oxide portion having a thickness in the stacking direction which is greater than that of the second oxide portion.

15. The semiconductor memory device according to claim 14, wherein
the first connecting line and the second connecting line are plate-like conductors having a principal plane along the stacking direction.

16. The semiconductor memory device according to claim 14, wherein
the columnar body includes a second semiconductor layer that contacts the first semiconductor layer and the semiconductor substrate.

17. The semiconductor memory device according to claim 16, wherein
the second semiconductor layer has an upper surface which is higher than an upper surface of the conductive layer in the stacking direction.

18. The semiconductor memory device according to claim 16, wherein
the second semiconductor layer has a side surface which is oxidized between from a lower surface to an upper surface of the conductive layer in the stacking direction.

19. The semiconductor memory device according to claim 16, wherein
the memory cell array includes a block insulating layer disposed between an upper surface of the conductive layer and a lower surface of the inter-layer insulating layer and between a side surface of the conductive layer and a side surface of the second semiconductor layer.

20. The semiconductor memory device according to claim 14, wherein
the memory cell array includes more of the first connecting lines than the second connecting lines.

* * * * *